219-121 SR
MTR04 XR 3,360,398

T121

Dec. 26, 1967 D. J. GARIBOTTI 3,360,398

FABRICATION OF THIN FILM DEVICES

Filed March 11, 1965

INVENTOR
DOMENICK J. GARIBOTTI
BY Roger A. Van Kirk
ATTORNEY

United States Patent Office 3,360,398
Patented Dec. 26, 1967

3,360,398

FABRICATION OF THIN FILM DEVICES

Domenick J. Garibotti, Longmeadow, Mass., assignor to United Aircraft Corporation, East Hartford, Conn., a corporation of Delaware Filed Mar. 11, 1965, Ser. No. 438,935
4 Claims. (Cl. 117—212)

This invention relates to thin film electrical circuit components. More particularly this invention is directed to an improved method for the fabrication of thin film devices.

While not restricted thereto in its utility, this invention will be described in connection with the fabrication of thin film capacitors. It is, however, to be understood that this invention is applicable to the fabrication of any thin film electrical circuit component wherein a step in the manufacture thereof comprises the selective removal of portions of a deposited film of conductive or semiconductive material. In the usual case, a thin film capacitor comprises a substrate and layers of material bonded thereto. For example, a common form of thin film capacitor comprises a ceramic wafer upon which two conductive films separated by a dielectric layer have been deposited. Present techniques for the fabrication of thin film capacitors normally comprise the formation of the multilayer structure on the substrate by techniques such as vacuum deposition or sputtering through a mask. Once the conductive layers, which form the capacitor plates, and the separating dielectric layer have been deposited, a plurality of devices may be isolated from each other by various state-of-the-art techniques. Experimentation has shown that superior results are achieved when isolation is accomplished through selective removal of the deposited films by means of etching with an energized beam such as generated by an electron beam generator or laser. For a complete discussion of the advantages inherent in producing isolation by a subtractive process utilizing an energized beam, reference may be had to copending application Ser. No. 362,853, filed April 27, 1964, now Patent No. 3,330,696, by myself and L. R. Ullery, Jr., as coinventors and assigned to the same assignee as this application.

As clearly revealed in the aforementioned copending application, isolation and trimming to desired values of thin film components may be advantageously accomplished by use of an energized beam. When so using an energized beam, a layer or layers of the previously deposited thin films are removed by causing local vaporization thereof with the beam. It has been found that occasionally there is redeposition of metallic material back into the region etched. This redeposition is reportedly due to the nonlinear behavior of the vaporized atoms which is in turn caused by the high density of gas resultant from the high heat inputs associated with the beam. Redeposition of conductive material such as forms resistive elements or capacitor plates, will, of course, provide leakage paths and thus the resulting devices will not obtain the desired values.

This invention overcomes the above-described problem associated with redeposition of milled material and thus provides a method of producing thin film circuit components having extremely fine tolerances.

It is therefore an object of this invention to fabricate thin film electrical circuit components.

It is a further object of this invention to fabricate thin film electrical circuit components having lower tolerances than previously available.

It is also an object of this invention to fabricate thin film electrical circuit components by a process which is capable of automation and susceptible of reproducibility.

It is yet another object of this invention to fabricate thin film electrical circuit components having low tolerances rapidly and inexpensively.

It is still another object of this invention to fabricate thin film electrical circuit components by a method which produces a higher yield of usable devices than any previously proposed.

These and other objects of this invention are accomplished by creating an oxidizing atmosphere in the region of the beam impingement point during the isolation or trimming of thin film electrical circuit components with an energized beam so as to oxidize metallic vapors produced in the milling process thereby preventing their redeposition as conductive material.

This invention may be better understood and its various advantages will become obvious to those skilled in the art by reference to the accompanying drawing wherein like reference numerals refer to like elements in the various figures and in which.

Figures 1, 2, 3, 4, 5, 6:
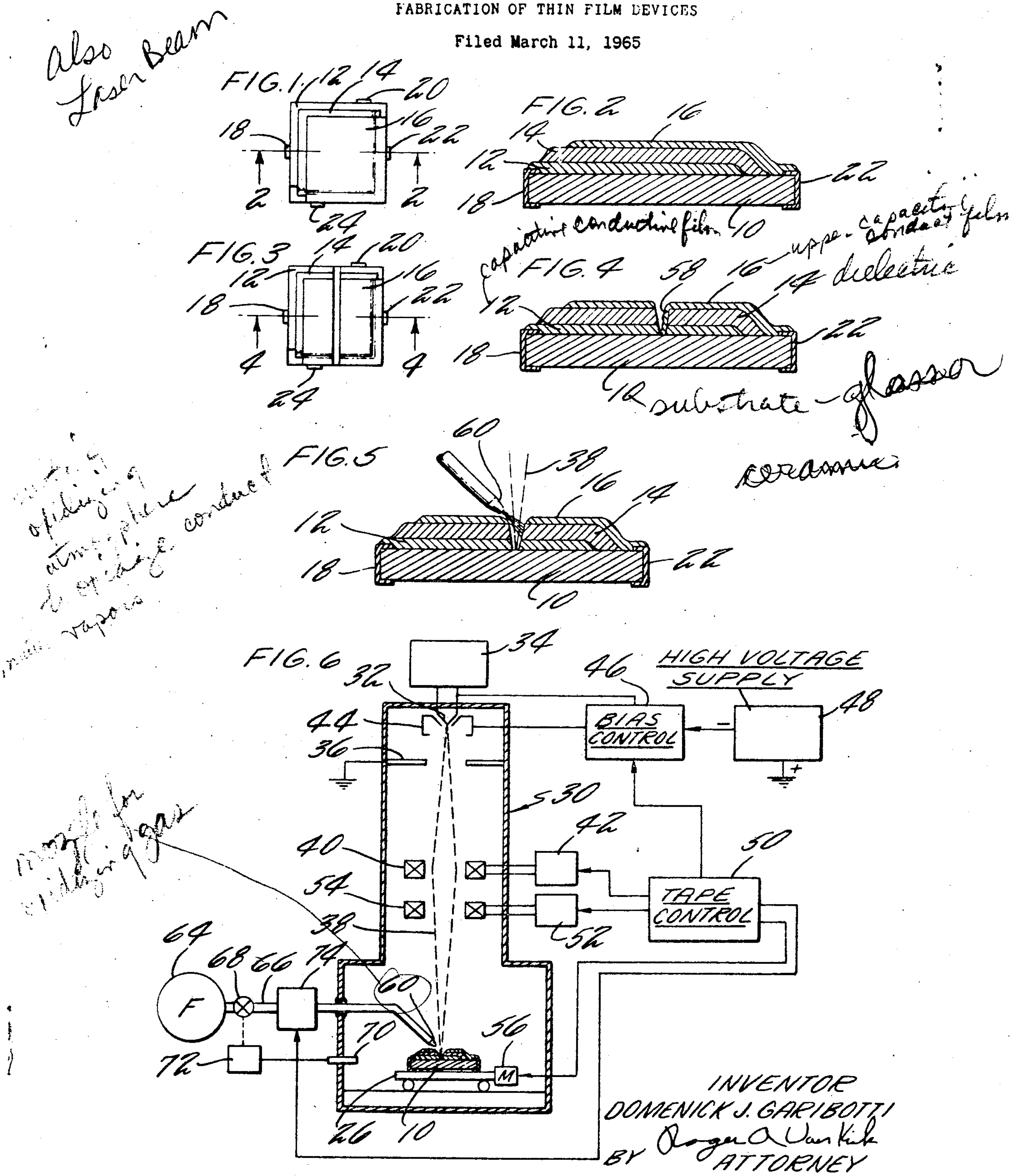
FIGURES 1 through 3 and 5 illustrate various stages or steps in the fabrication of a thin film capacitor in accordance with this invention.
FIGURE 4 depicts the often achieved undesirable result of prior art fabrication methods.
FIGURE 6 illustrates apparatus used in performance of the steps depicted by FIGURES 3 and 5.

To fabricate a capacitor in accordance with this invention, the conductive and dielectric films must first be deposited on a substrate. As a general rule, the three layers are deposited as area films through three masks to produce the overlapping structure best shown by FIGURES 1 and 2. In these figures, the substrate is indicated as 10, the lower conductive film or capacitor plate at 12, the dielectric material at 14 and the upper conductive film or capacitor plate at 16. As shown in the drawing, contact may be made to the lower conductive layer by contact pads 18 and 20 and to the upper conductive layer by contact pads 22 and 24. These contact pads are deposited on the substrate by state-of-the-art techniques prior to the build-up of the multilayer structure.

To be suitable, the substrate material must conform to the requirements imposed by the various process steps. It is preferred that the substrate be possessed of a smooth surface which is completely free of sharp changes in contour. The substrate should also be able to withstand temperatures as high as 300 to 400° C. since it may be heated to temperatures in this range during the deposition steps. Also, the substrate material should have a high resistivity. Preferred substrate materials for this invention consist of glasses and ceramics. After cleaning according to practices well known in the art, the substrate will be suitably positioned behind the mask in a vacuum deposition apparatus. The techniques for applying the films to the substrates are well known in the art and thus their details are not considered a part of this invention. For a complete explanation of such vacuum deposition techniques, reference may be had to "Vacuum Deposition of Thin Films," by L. Holland, published by John Wiley and Sons, Inc., New York, 1956. In one example, conductive films 12 and 16 may be vacuum deposited aluminum 3000 angstroms thick while dielectric layer 14 will be vacuum deposited SiOx 10,000 angstroms thick. The three deposition steps, as mentioned above, utilize three masks so as to produce the multilayer structure shown in FIGURES 1 and 2. In this structure, lower conductive layer or plate 12 is in electrical contact with pads 18 and 20 and is insulated from upper conductive layer 16 by dielectric 14. Upper conductive layer 16 wraps around dielectric layer 14 and makes electrical contact with terminal pads 22 and 24.

After stabilization by annealing, at 200° C. in the case of the above composite, and cooling to room temperature, the multilayer structure shown in FIGURES 1 and 2 is ready for isolation into a plurality of individual thin film capacitors and/or trimming to the desired value or values. For such purposes, apparatus capable of producing an intense beam of electrons has been found to be a desirable tool. Such apparatus is shown in FIGURE 6. In this figure, the substrate 10 with the three layers deposited thereon is depicted as being located on a movable work table 26 in the vacuum chamber of an electron beam machine. As noted above, and as will be explained more fully below, there are a number of advantages inherent in the use of an electron beam as a tool for working materials. In order to obtain these advantages, the electron beam generator utilized must be a precision instrument capable of providing a highly focussed, intense beam of electrons. United States Patent No. 2,987,610 issued June 6, 1961, to K. H. Steigerwald, discloses a suitable electron beam machine. Apparatus such as that shown in the Steigerwald patent can provide a beam of electrons focussed to produce power densities on the order of 10 billion watts per square inch. Such beams may be collimated so as to have diameters in the micron region at the point of impingement on the work. An electron beam is a tool which has practically no mass but has high kinetic energy because of the extremely high velocity imparted to the electrons. Transfer of this kinetic energy to the lattice electrons of the workpiece generates higher lattice vibrations which cause an increase in temperature within the impingement area sufficient to accomplish work. In an electron beam substrative process, the increase in temperature is extremely rapid and of sufficient magnitude to cause vaporization of the material impinged upon. As mentioned above, there are a number of inherent advantages using the electron beam as a tool to work materials. The most important of these advantages resides in the fact that an electron beam as a tool can be easily controlled since it may be readily focussed, its power simply adjusted and it may be precisely deflected electrically to any desired point.

Referring now again to FIGURE 6, an electron beam machine is shown generally as 30. In machine 30 electrons are emitted by a directly heated cathode 32 which is connected to a source of heating current 34. The electrons emitted by cathode 32 are caused to be accelerated toward a workpiece by a negative D.C. acceleration voltage which is applied between cathode 32 and a grounded, apertured anode 36. The accelerated electrons are focussed into a beam 38 by means clearly shown and described in the abovementioned Steigerwald patent. The electron beam 38 is focussed to provide the desired beam diameter or spot size at the workpiece by varying the current supplied to a magnetic lens assembly 40 from a lens current supply 42. Initially beam 38 will be gated off by a blocking voltage applied between the cathode 32 and the control electrode 44 by a bias voltage control 46. Bias voltage control 46, which is connected between the negative terminal of acceleration voltage supply 48 and the cathode and control electrode, may be of the type disclosed in copending application Ser. No. 214,313, filed Aug. 2, 1962, by J. A. Hansen and assigned to the same assignee as this invention. Beam 38 will be gated on in response to commands generated by a tape control 50 and supplied to bias control 36. Beam 38 may be caused to trace a desired pattern on the workpiece, which in this case is the multi-layer structure formed on substrate 10, by varying the current supplied by deflection voltage supply 52 to a set of magnetic deflection coils 54, only two of which are shown, or by causing motor 56 to drive movable table 26 in the desired direction. Both the beam deflection and the movement of table 26 may be programmed by information read into tape control 50. Tape control 50, which may be any well known means for storing several channels of digital information and for reading out this information in analog form, also may be utilized to control the beam itensity and thus its penetration by controlling the magnitude of the pulses supplied to control electrode 44 by bias control 46. Similarly, control 50 may be utilized to control the focus of the beam by regulating lens current supply 42.

As mentioned above, the first step in the formation of a thin film device in accordance with this invention comprises the deposition or otherwise forming of the layer or layers of material on the substrate. In the example being described, this results in the multilayer structure depicted in FIGURES 1 and 2. This multilayer structure is positioned on the movable work table 26 in the work chamber of electron beam machine 30 and the table is positioned generally in line with the axis of beam 38. The work chamber is then evacuated and the beam generator activated. As mentioned above, one of the first steps in the fabrication of multilayer structures comprises the formation of contact pads 18, 20, 22 and 24 on the edges of substrate 10. Since, in the example situation to be described, four contact pads are established on the substrate, the multilayer structure lends itself to the fabrication of two thin film capacitors. However, it is to be understood that more than two such devices may be isolated on one surface of the substrate and that the other side of the substrate may also be utilized for the fabrication of thin film devices or for the mounting of other passive or active circuit elements. After proper positioning of the multilayer structure in the electron beam machine, tape control 50 will take command and control the operation. However, the process to be explained below may be controlled manually by the operator of the machine. In the prior art, since the multilayer structure had already been produced, the operation would be completed by the single additional step of isolating the deposited films into the desired number of individual thin film components. In the example being explained, the result of this isolation step is shown in FIGURES 3 and 4. In order to accomplish isolation, the beam intensity and the rate of relative movement between the beam and the work are selected such that the beam will penetrate through all three layers but will cause, in the most extreme situation, only very light fusing of the surface of the substrate. In the case where beam deflection is utilized to produce the relative motion, the beam will preferably be deflected across the workpiece and will operate in a pulsed mode. That is, the beam will be deflected across the surface of the workpiece while being pulsed on and off thereby generating a series of overlapping beam impingement points. Utilizing a pulsed mode of operation minimizes the heat effected zone by giving material adjacent the beam impingement point an opportunity to cool down between pulses. However, due to the extremely high kinetic energy of the electrons which comprise beam 38, the material in the path of the beam will be vaporized and a cut or groove, as shown in FIGURES 3 and 4, wherein material has been removed will result.

FIGURE 4 clearly depicts the undesirable result often achieved in the prior art. In FIGURE 4, 58 indicates aluminum which has been redeposited on the sides of the groove cut by the electron beam during the isolation step. Material 58 was first evaporated then, as the beam moved on, the aluminum vapor condensed on the sides of the groove. The redeposition of this aluminum either short-circuits or provides leakage paths between the plates of the thin film capacitor formed between contact pads 20 and 22. This redeposition, of course, results in an unusable substrate which may previously have had a plurality of thin film devices formed on the other side thereof at considerable cost.

In accordance with this invention, in order to eliminate the redeposition of vaporized material as shown at 58 of FIGURE 4, a jet of oxidizing gas is directed on the area of the work directly behind the beam. As shown in FIGURE 5, the jet of gas emanates from a nozzle 60 which may, in the manner to be described below, be positioned so as to direct the gas into the groove being cut directly behind the working electron beam. This controlled gas leak oxidized the metallic vapors produced this eliminating the possibility of short-circuiting or formation of leakage paths by recondensed metal. In the example being discussed, the Al vapors will react with the $O_2$ gas to form nonconductive $Al_2O_3$ which, if it is redeposited, will not have a deleterious effect. As should be obvious, the controlled oxygen leak must be such that the vacuum pumps which maintain the work chamber at the desired pressure can still keep chamber pressure within the required limits. It should also be noted that the oxygen accomplishes another beneficial effect by forming a thin protective oxide on the cut edge of the material being milled. This oxide layer protects the thin film device under service conditions.

The position of nozzle 60 may be controlled manually by the operator who can observe the process through an optical viewing system of the type shown in the abovementioned Steigerwald patent. Alternatively, the position of nozzle 60 may be fixed and the relative movement between the beam and the work accomplished by programmed movement of work table 26. As a third possibility, the isolation step may be accomplished by employing programmed electron beam deflection and nozzle movement. As can be clearly seen from FIGURE 6, the oxidizing gas is applied to nozzle 60 from a pressurized source 64 located exteriorly of the electron beam machine's work chamber. Gas from source 64 is transmitted to nozzle 60 through a conduit 66 at the desired rate by a valve 68. The amount of gas fed to nozzle 60 may be automatically controlled by utilization of a pressure sensor 70 and associated servo system 72 for sensing the pressure in the work chamber and controlling the oxygen leak in accordance therewith by adjusting valve 68. As noted above, the movement of nozzle 60 may be programmed to track along behind the beam 62 as it is deflected across the work under command of tape control 50. For this purpose there is provided a servo system 74 which is also under the control of tape control 50. System 74, which obviously also includes flexible portions of conduit 66, controls the movement of the portion of conduit 66 downstream of valve 68 and thus also controls the location of nozzle 60. System 74 is preferably located outside of the work chamber of the electron beam machine and motion is transmitted through the wall of the vacuum chamber without coincident gas leakage by means well known in the art.

While on embodiment has been shown and described, various modifications may be made without deviation from the spirit and scope of this invention. For example, while this invention has been explained in connection with the fabrication of the plurality of thin film capacitors on a single surface of a substrate, it may be also beneficially used in the scribing on thin film resistors in accordance with the process shown in United States Patent No. 3,140,379 issued July 7, 1964, to F. Schleich et al. Also, while the method of this invention has been described as preferably being performed with an intense beam of electrons, it is conceivable that the energized beam generated by a laser could also be used to achieve the same results. Further, while described in association with a beam generator employing a work chamber, recent developments in working outside the vacuum with an electron beam are readily adaptable for use in the practice of this invention. Thus, the foregoing description and explanation is not to be considered as limiting this invention which is defined solely by the appended claims taken in view of the prior art.

I claim:

1. A method of fabricating a thin film electronic circuit component which comprises:
   depositing at least a first layer of conductive material on a nonconductive substrate,
   selectively removing a portion of the previously deposited layer with an energized beam, and
   simultaneously providing an oxidizing atmosphere in the region being impinged upon by the energized beam.

2. A method of fabricating a thin film electronic circuit component which comprises:
   forming at least a first layer of conductive material on a nonconductive substrate,
   directing an intense beam of electrons across the surface of the previously formed layer to cause local evaporation of the conductive material, and
   simultaneously directing a jet of oxygen adjacent to the beam impingement point to thereby oxidize the conductive material vapors.

3. A method of fabricating a thin film capacitor comprising:
   depositing a first layer of conductive material on a nonconductive substrate;
   providing a layer of dielectric material over the first layer of conductive material;
   forming a second layer of conductive material over the layer of dielectric material;
   directing an energized beam on the multilayer structure to remove the conductive and dielectric materials from the substrate along lines to isolate individual devices; and
   simultaneously creating an oxidizing atmosphere in the area adjacent the beam impingement point.

4. The method of fabricating a thin film capacitor comprising:
   depositing a conductive material on a nonconductive substrate as an area film,
   providing a layer of dielectric material over the conductive material,
   forming a second area film of conductive material over the layer of dielectric material,
   causing localized evaporation of the conductive and dielectric materials along lines to isolate individual devices, and
   creating an oxidizing atmosphere in the area where evaporation is being caused to thereby oxidize the vaporized conductive material to prevent its redeposition as conductive material.

References Cited

UNITED STATES PATENTS

| | | | |
|---|---|---|---|
| 3,056,881 | 10/1962 | Schwarz | 117—93.3 |
| 3,234,044 | 2/1966 | Andes et al. | 117—2 X |
| 3,330,696 | 7/1967 | Ullery et al. | 117—212 |

ALFRED L. LEAVITT, *Primary Examiner.*

A. GRIMALDI, *Assistant Examiner.*